SOLID-STATE MAGNETOELECTRIC MODULATOR AND SWITCH
Filed Dec. 9, 1965
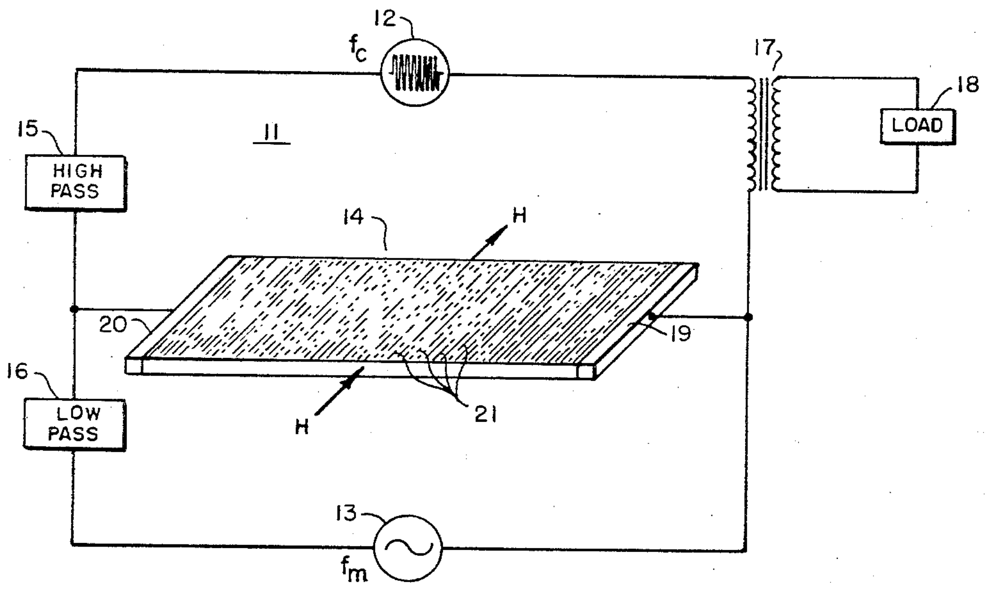
INVENTOR,
HERBERT L. METTE.
BY Harry M. Saragovitz
Edward J. Kelly, Herbert Berl
& Julian C. Keppler
ATTORNEYS 3,435,379

SOLID-STATE MAGNETOELECTRIC MODULATOR AND SWITCH

Herbert L. Mette, Neptune, N.J., assignor to the United States of America as represented by the Secretary of the Army Filed Dec. 9, 1965, Ser. No. 523,483
Int. Cl. H03c *1/36*
U.S. Cl. 332—52 4 Claims

ABSTRACT OF THE DISCLOSURE

An amplitude modulator comprising a slab of semiconductive material having a pair of ohmic contacts mounted on opposite ends and having one major surface etched smooth and the other major surface ground rough to produce low and high surface recombination velocities. A first signal generator is connected across the ohmic contacts and produces the modulating signal of a frequency below a predetermined value. A second signal generator is also connected across the ohmic contacts and produces the modulated signal which is of a frequency above the predetermined value. A magnetic field is applied to the semiconductor to deflect carriers towards the major surfaces in accordance with the strength of the lower frequency signal.

The present invention relates to amplitude modulation circuits, and more particularly, to a solid-state magnetoelectric modulator and switch.

In the field of electronics it has been the general practice in designing amplitude modulator circuits to employ semiconductor elements such as transistors, diodes, or bulk semiconductors which are capable of attenuating the intensity of a carrier wave in response to a modulating wave. In such circuits, the carrier wave is usually applied across the semiconductor device while the modulating wave is applied to the semiconductor device in such a manner as to vary the conductivity of the semiconductor.

The transistor, when used as a modulator, may have the carrier wave applied in the form of a current flowing between the collector and emitter terminals while the modulating wave is applied to the base. Although transistors having reasonable power handling capabilities, have found widespread use as modulators at lower frequencies, their use at higher frequencies is limited to very low power operation because the junction areas must be small to obtain capacitance at these higher frequencies.

Bulk semiconductor elements which have little or no capacitance at higher frequencies are now finding widespread use as modulators at frequencies above UHF. One such device comprises a slab of semiconductor material placed across the interior of a waveguide. A small portion of the slab extends out of the waveguide and is highly doped to form, for example, an NN+ junction. The low doped region has a low conductivity and permits energy propagated in the waveguide to pass through the slab with little attenuation. A modulating current is then passed through the junction to inject carriers from the highly doped region into the olw doped region to enhance the conductivity of the latter region. With this increase in conductivity of the slab, energy in the waveguide is easily coupled to the slab where it is absorbed or reflected to attenuate the energy in accordance with the modulating current wave. At higher frequencies the NN+ junction will be relatively small since the waveguides at these frequencies have small cross-sectional areas. However, at lower frequencies waveguide structures become large causing the NN+ also to be large and therefore the capacitance which this junction presents to high frequency modulating waves becomes a limiting factor. Furthermore, carriers that are injected through the NN+ junction will be slow to diffuse and drift through the slab of semiconductor which will be substantially as large as the waveguide cross-section. This will impose a limit on response time and result in a device limited to low modulating frequencies and low efficiencies. An example of such a device may be found in Patent No. 2,977,551 to Gibson et al.

To avoid the use of a junction, modulator devices have been designed to include a slab of intrinsic semiconductor material, the conductivity of which is varied by either a variable temperature or light means which is controlled by the modulating wave. An example of the latter method may be found in Patent No. 3,096,494 to Jacobs et al. This patent shows a slab of semiconductor placed in a waveguide having an opening therein. A modulated light source placed outside the waveguide is directed through the opening and focused onto the slab. The number of equilibrium carriers in the slab will depend on the intensity of the light and the conductivity of the slab will depend on the number of these carriers. Although this scheme avoids the use of a junction, it is expensive and cumbersome since a complex modulated light source is required.

Therefore, those concerned with the development of amplitude modulators have long recognized the need for a relatively high powered, solid-state modulator which can be controlled by simple electronic circuitry and is free of high frequency capacities.

It is, therefore, an object of the present invention to provide a solid-state amplitude modulator which is capable of relatively high power operation.

Another object is to provide a solid-state modulator which is free of high frequency capacitances thereby not subject to a phase shift of the carrier wave.

A further object of the present invention is the provision of a solid-state modulator which requires inexpensive and simple electronic circuitry.

Other objects and many of the attendant advantages of this invention will be readily appreciated as the same becomes better understood by reference to the following detailed description when considered in connection with the accompanying drawing which shows a schematic diagram of a preferred embodiment of the invention.

Referring now to the drawing, there is shown a modulator 11 having a carrier frequency generator 12, a modulating frequency generator 13, a semiconductor slab 14, high and low pass filters 15 and 16 respectively, an output transformer 17, and a load 18.

Generator 13 and low pass filter 16, which are connected in series are connected across slab 14. Slab 14 is provided with ohmic contacts 19 and 20 to effect this connection. Also connected across slab 14 and to contacts 19 and 20 are generator 12, filter 15, and the primary coil of transformer 17 which are all connected in series with each other. Load 18 is connected across the secondary of transformer 17.

It is to be understood that the connections shown in the drawings are only schematic. As the discussion progresses it will become obvious that the actual location of slab 14 may be in a waveguide, or between a parallel strip line, or across parallel wires, or at the termination of a coaxial line. In most of these cases, the transmission means itself will perform the function of the high pass filter 15 while the output or load 18 may be coupled to the transmission means by a transformer as shown or by any other coupling device suitable for the particular transmission means employed. The particular type of transmission means employed would depend, of course, on the frequency of the carrier wave. Filters 15 and 16 are, of course, provided to reject the modulation and carrier frequencies $f_m$ and $f_c$ from each other's circuit.

The slab 14 comprises a flat piece of intrinsic semiconductor material having one major surface thereof ground rough as at 21 to produce a relatively high surface recombination velocity and the opposite major surface thereof etched smooth to produce a relatively low surface recombination velocity. The slab 14, as such, will act as a resistor and the electrical characteristics thereof will be ohmic for currents flowing between the ohmic contacts 19 and 20.

However, if a magnetic field such as H is applied perpendicular to the direction of current flow and parallel to the major surfaces of slab 14, the carriers in slab 14 will be deflected to one of the major surfaces depending on the direction of the magnetic field H and the flow of current. If the carriers are deflected to the high recombination side of the slab 14, they recombine faster than if deflected to the low recombination side, their lifetime is shorter, and the number of carriers in the sample is reduced. Because of this reduction of carriers, the slab 14 will become less conductive and therefore present a high resistance to current flow. When the current is reversed and the carriers are deflected to the smooth or low recombination side of the slab 14 their lifetime is longer and the number of equilibrium carriers in the sample is increased. The slab 14 will now become more conductive or less resistive to current flow. Therefore, slab 14 will act somewhat as a rectifier when an AC wave is applied thereto, i.e., the slab 14 will be conductive for one of the half cycles and resistive for the other half cycle.

It has now been found, however, that above a certain threshold frequency, which will depend mostly on the thickness of slab 14 and the mobility of the carriers therein, the slab 14 will present a relatively constant low resistance for currents flowing in either direction. It appears that because of the short periods at high frequencies the carriers do not have time to reach either of the two major surfaces and the number of equilibrium carriers remains substantially constant and equal over both half cycles. For example, it has been found for energy having frequencies which are over a megacycle, a 0.2 mm. thick germanium sample presented a constant resistance which was equal for both half cycles.

Slab 14 is, therefore, a two terminal, solid-state semiconductor in which carrier lifetime and, therefore, equilibrium carrier density can be changed by a low frequency wave but is not influenced by a higher frequency wave. The magnitude of the higher frequency wave will depend, however, on the number of carriers available in the semiconductor. Therefore, if the frequency $f_m$ of the modulating wave from generator 13 is less than this aforementioned threshold frequency and the frequency of the carrier wave $f_c$ is higher than this threshold frequency, then the intensity of the carrier wave will be modulated in accordance with the modulating wave from generator 13. It is understood, of course, that if generator 13 generates DC pulses, the circuit 11 will act as a switch which is merely a special case of an amplitude modulator.

Since the slab 14 does not contain junctions the only restriction in power is the heat produced in the slab itself. Experimental samples that were freely suspended in air at room temperature could tolerate powers up to a half watt. Since the slab 14 is thin and flat, it could be easily coupled to a heat sink and tolerate a multiple of that power.

Obviously, many modifications and variations of the present invention are possible in the light of the above teachings. It is, therefore, to be understood, that within the scope of the appended claims, the invention may be practiced otherwise than as specifically described.

What is claimed is:

1. A modulator circuit comprising, a semiconductor element having opposed major surfaces between which exists a current path; a first of said major surfaces having a high surface recombination velocity, and the second of said major surfaces having a low surface recombination velocity; means for applying a magnetic field normal to said current path and parallel to said major surfaces; said element having symmetrical conduction characteristics for frequencies above a predetermined frequency and having asymmetrical conduction characteristics at frequencies below said predetermined frequency; first generator means for coupling energy to said element to excite currents in said current path at a carrier frequency which is higher than said predetermined frequency; second generator means for coupling energy to said element to excite currents in said current path at a modulation frequency which is lower than said predetermined frequency; output means for coupling from said element modulated carrier frequency energy; and means connecting said first generator means and said output means across said element and for connecting said second generator means across said element.

2. The modulator according to claim 1 and wherein said first major surface is smooth and said second major surface is rough.

3. The modulator according to claim 2 and further including filter means connected to said generator means for isolating each said generator from each other.

4. The modulator according to claim 3 and wherein said output means is connected between one terminal of said element and one terminal to said first generator means.

References Cited

UNITED STATES PATENTS 2,100,458 11/1937 Walter ------------- 329—205

FOREIGN PATENTS 634,403 3/1950 Great Britain.

OTHER REFERENCES

Yhap et al.: Logical Device, IBM Technical Disclosure Bulletin, pp. 59–60, February 1960.

ROY LAKE, *Primary Examiner.*

L. J. DAHL, *Assistant Examiner.*

U.S. Cl. X.R.

329—205